(12) United States Patent
Forman (10) Patent No.: US 7,256,667 B1
(45) Date of Patent: Aug. 14, 2007

(54) WAVEGUIDE DEVICE AND METHOD FOR MAKING SAME

(75) Inventor: Michael A. Forman, San Francisco, CA (US)

(73) Assignee: Sandia National Laboratories, Livermore, CA (US)

( * ) Notice: Subject to any disclaimer, the term of this patent is extended or adjusted under 35 U.S.C. 154(b) by 283 days.

(21) Appl. No.: 11/149,404

(22) Filed: Jun. 8, 2005

(51) Int. Cl.
*H01P 3/00* (2006.01)
*H01P 5/12* (2006.01)
*G03C 5/00* (2006.01)
*G02B 6/10* (2006.01)
*G02B 6/136* (2006.01)

(52) U.S. Cl. .................. 333/238; 333/239; 333/137; 430/318; 385/132

(58) Field of Classification Search .............. 333/238, 333/239, 137; 430/316, 318; 385/129, 132
See application file for complete search history.

(56) References Cited

U.S. PATENT DOCUMENTS

| 5,858,622 A * | 1/1999 | Gearhart ............... 430/315 |
| 7,016,587 B2 * | 3/2006 | Kubby et al. ........... 385/129 |
| 2005/0249256 A1 * | 11/2005 | He ....................... 372/50.1 |

* cited by examiner

*Primary Examiner*—Dean Takaoka
(74) *Attorney, Agent, or Firm*—Sughrue Mion, PLLC; Joseph Bach (57) ABSTRACT

A monolithic micromachined waveguide device or devices with low-loss, high-power handling, and near-optical frequency ranges is set forth. The waveguide and integrated devices are capable of transmitting near-optical frequencies due to optical-quality sidewall roughness. The device or devices are fabricated in parallel, may be mass produced using a LIGA manufacturing process, and may include a passive component such as a diplexer and/or an active capping layer capable of particularized signal processing of the waveforms propagated by the waveguide.

20 Claims, 8 Drawing Sheets

WAVEGUIDE DEVICE AND METHOD FOR MAKING SAME

STATEMENT OF GOVERNMENT SUPPORT

The United States Government has rights in this invention pursuant to Contract No. DE-AC04-94AL85000 between the United States Department of Energy and Sandia Corporation for the operation of Sandia National Laboratories.

CROSS-REFERENCE TO RELATED APPLICATIONS

This application incorporates by reference the patent application entitled Micromachined Microwave Signal Control Device and Method for Making Same, with Ser. No. 11/149,400, filed on the same day as the present application.

FIELD OF THE INVENTION

The present invention relates to monolithic micromachined waveguides for the transmission of microwave signals, and a method for making the same. The device may include integrated passive components such as a diplexer and/or an active component layer.

BACKGROUND OF THE INVENTION

Waveguides are critical components for radar and communications systems, and are often used in conjunction with switches, couplers, splitters, filters, and other components. Waveguides operate by controlling the propagation of an electromagnetic wave so that the wave is forced to follow a path defined by the physical structure of the guide.

Types of waveguides may be divided by the type of energy that is transmitted, including optical, microwave, and radio frequency transmissions. The present invention is concerned with the propagation of microwave energy, or energy in or near the microwave region of the electromagnetic spectrum.

A standard configuration for microwave waveguides is a structure that is comprised of a hollow metallic conductor, whether rectangular, elliptical, or circular in cross-section. The manufacture of conventional waveguides is a time, labor, and capital-intensive undertaking, involving either Computerized Numerical Control ("CNC") milling, turning and drilling or electroplating over existing molds. Further, traditional fabrication techniques cannot easily fabricate smaller high-quality, high-frequency waveguides.

The biggest disadvantage of conventionally fabricated waveguide components is that they must be individually fabricated and later assembled, leading to increased mass and cost. Further, there are limits to how small a conventionally fabricated waveguide can be made, limiting the frequency range of this particular type of waveguide.

SUMMARY OF THE INVENTION

The present invention relates to monolithic micromachined waveguide for the transmission of energy within or near the microwave region of the electromagnetic spectrum, and a method of manufacturing the same. The waveguide of the present invention includes the capability to be formed with high-aspect ratios including channels with heights of many hundreds of microns (or up to approximately 3 mm) and lateral widths of much less than a single micron (or approximately 0.2 microns), and the ability to transmit frequencies between 1 and 300 GHz with the greatest benefit realized at higher frequencies.

BRIEF DESCRIPTION OF THE DRAWINGS

The invention, both as to its organization and manner of operation, may be further understood by reference to the drawings that include FIGS. 1-8, taken in connection with the following descriptions.

DETAILED DESCRIPTION OF EMBODIMENTS

The following description of illustrative, non-limiting embodiments of the invention discloses specific configurations and components. However, the embodiments are merely examples of the present invention, and thus, the specific features described below are merely used to describe such embodiments to provide an overall understanding of the present invention. One skilled in the art readily recognizes that the present invention is not limited to the specific embodiments described below. Furthermore, certain descriptions of various configurations and components of the present invention that are known to one skilled in the art are omitted for the sake of clarity and brevity.

An embodiment of the present invention utilizes a manufacturing process known as "LIGA" (an acronym derived from the German "Lithographie, Galvanoformung, and Abformung"). The main steps of the LIGA process are deep x-ray lithography, electroforming, and plastic molding. The LIGA process has typically been used to create micromachinery components such as gears or levers for use in microelectromechanical ("MEMS") systems. In contrast, the present invention utilizes the LIGA process to create monolithic integrated microwave devices with internal propagating surfaces possessing surface finishes of optical quality smoothness of less than 50 nm rms roughness, a feature absent from some conventional waveguides due to the relatively abrupt/rough nature of waveguide formation. Because the structures can be fabricated in parallel in a single uniplanar fabrication process, they eliminate the higher weight, time, and cost associated with milled components. The creation of a waveguide according to an embodiment of the present invention utilizing the LIGA process is described in greater detail below.

Figure 1:
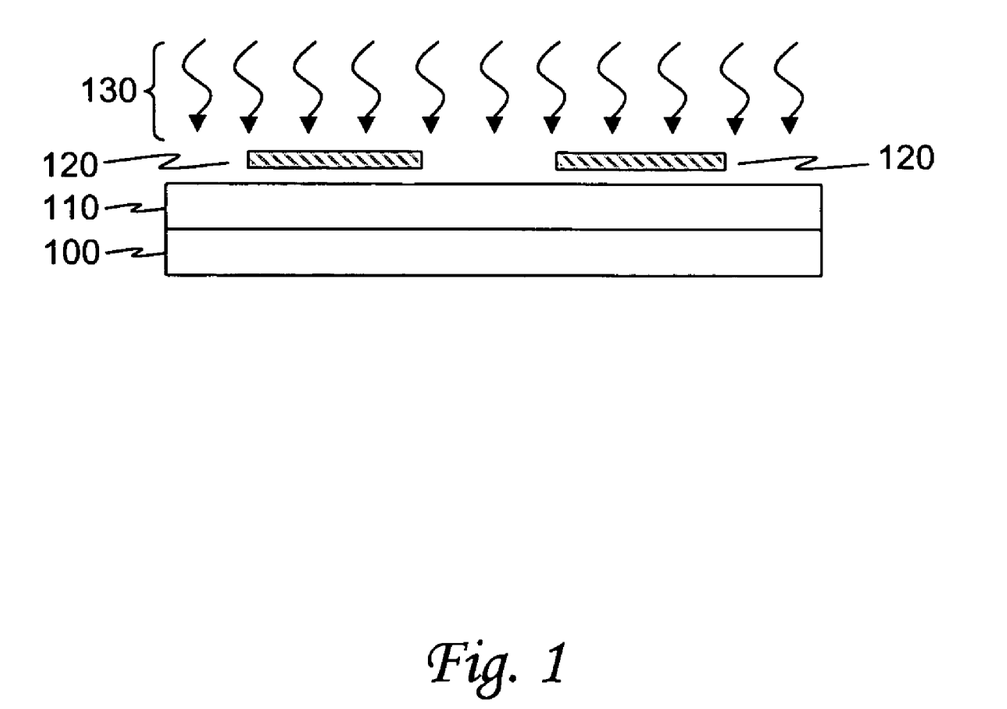
FIG. 1 is a side-view illustration of a portion of a manufacturing process used to create an embodiment of the invention.

Prior to the process depicted in FIG. 1, a mask 120 is created using, for example, a Computer Aided Design ("CAD") program such as AutoCAD®. While the embodiments of the invention described herein are illustratively created using a gold-plated mask as part of the process, the mask may be chrome or chrome plated, or may be of another material, so long as it is x-ray resistant. Typically, the mask 120 is a singular wafer or disk, but could be created in multiple pieces. The purpose of the mask is to shadow particular portions of the surface 110 to create a pattern thereon. In all embodiments the mask 120 includes slots or holes that allow radiation 130 to pass to the surface 110 below the mask 120. The ordinarily skilled artisan readily comprehends that there are various methods of mask creation, including the inventors' use of a CAD such as AutoCAD® to create a mask. A side view of mask 120 is depicted in FIG. 1.

FIG. 1 illustrates a portion of the manufacturing process used to produce an embodiment of the present invention. As shown, the mask 120 possesses slots or holes through which radiation 130 is allowed to travel, thereby reaching the surface 110. In the embodiments described herein, x-rays are used as the radiation 130. However, other forms of energy may be used, including laser light, electron or ion beams, or ultraviolet light, as those of ordinary skill in the art readily comprehend.

The x-rays 130, which may be created with a synchrotron, are painted in a predetermined pattern on the surface 110 through the slots in the mask 120. Surface 110 is a photoresist that has previously been applied to substrate 100, and typically is composed of a high molecular weight polymethylmethacrylate ("PMMA") that has been glued or polymerized to the substrate 100. The thickness of the applied PMMA is determined relative to an upper limit of the height of the waveguide of the present invention created through the LIGA process, and is generally on the order of hundreds of microns or up to two or three millimeters in depth. The type of photoresist used as the surface 110 depends upon the type of irradiation utilized to paint the surface 110 with the desired pattern. For instance, while PMMA works well with x-rays, other resists could be utilized for photolithographic UV painting, such as SU-8.

Foundation 100 may be a metallized or metallic substrate. For instance, the foundation 100 may be a metallized silicon wafer of about 2 mm in thickness, or the foundation 100 may be a metallic plate of about the same thickness. However, the embodiment set forth herein utilizes a quartz substrate 100 which has been metallized with a titanium/copper/titanium layer (a waveguide of the present invention including copper on a Ti/Cu/Ti-covered quartz substrate achieved a measured attenuation of 0.064 dB/cm at 15.5 GHz). The ordinarily skilled artisan readily understands that additional metals could be used, for instance aluminum or copper.

Following irradiation, the device is transferred to a wet bench/developer so that the portions of the surface 110 that have been irradiated may be removed through application of a chemical reactive process. The reactive process may be an acid, solvent, or a base bath. The embodiment described herein utilizes a custom chemical mixture in three tanks, including an initial bath of a solvent mixture of ethylene glycol, butyl ether, morpholine, and ethanolamine, followed by an intermediate rinse which may be of tetramethylammonium hydroxide, potassium hydroxide, alcohol or ionized water, followed by a final rinse of ionized water. The developer and intermediate rinse tanks include a megasonic agitation unit, and all tanks include a filter with a membrane of 0.2 microns or less. The invention is dipped into the baths beginning with the developer bath, where the irradiated portion of the surface 110 is allowed to dissolve. The invention is then rinsed in the intermediate bath and with a final rinse of ionized water. Notably, since the cross-absorption and scattering rates of the x-rays into the non-irradiated portions of the PMMA is so low there is virtually no undercut as the PMMA is developed, resulting in extremely linear vertices.

The artisan of ordinary skill comprehends that other processes could be used to remove the irradiated portions, including an acid bath or a base bath, or a different solvent bath.

Figure 2:
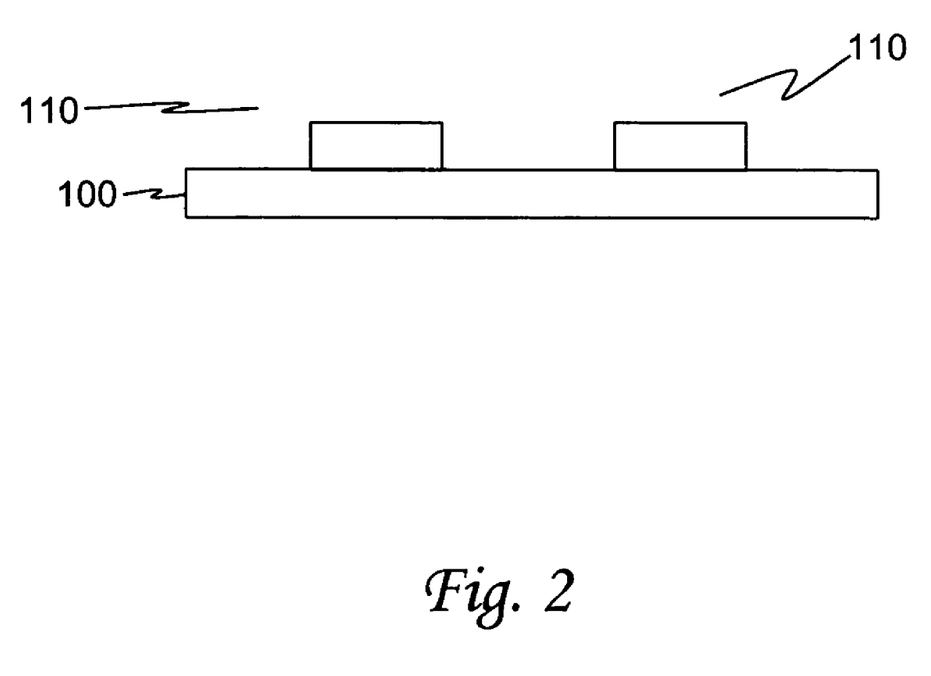
FIG. 2 is a side-view illustration of an additional portion of the manufacturing process.

The device emerging from the developer process is depicted in FIG. 2.

FIG. 2 illustrates a substrate 100 on which the PMMA 110 is shown with channels therein. The channels illustrate the previously irradiated portions of the PMMA 110 that have been removed through chemical reaction and are now capable of being used as a mold to facilitate the application of a metal to the substrate 100. In the embodiment of the invention described herein, copper is applied to the channels, as described below. However, other metals could be used. A non-inclusive list includes silver, gold, nickel, or even alloys such as nickel-cobalt, nickel-iron or bronze.

Figure 3:
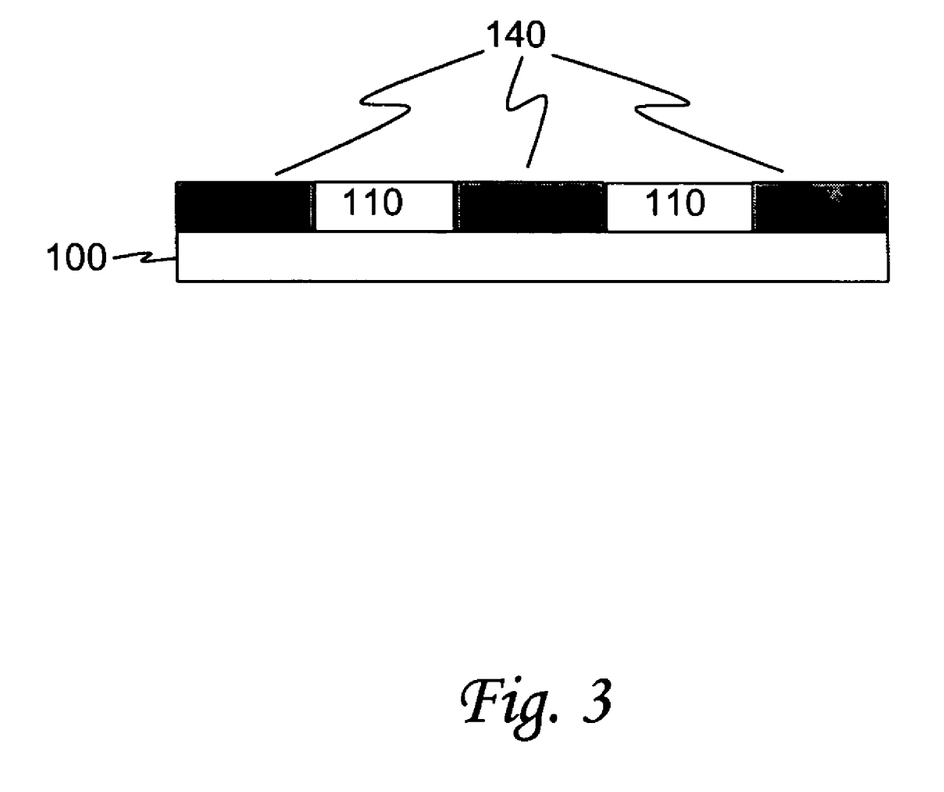
FIG. 3 is a side-view illustration of an additional portion of the manufacturing process.

FIG. 3 illustrates a further step in the manufacturing process of the device of the present invention wherein the channels depicted in FIG. 2 are filled with metal 140 through use of an electroplating (also known as electrodeposition) process. The device is connected to an electrical circuit thereby forming an anode and a cathode, and is then placed in a bath with free-floating copper ions. Electrical current passing through the circuit causes the copper ions to be attracted to the device. Over time, the channels in the surface 110 are filled with an even layer of copper 140.

The ordinarily skilled artisan comprehends that a non-electrical deposition process could also be utilized, such as an electrochemical mechanical deposition or an electroless plating deposition using a chemical process. For instance, a chemical vapor deposition ("CVD") process could be employed utilizing copper (II) hexafluoroacetylacetonate ($Cu(HFA)_2$). The $Cu(HFA)_2$ could be mixed with pure hydrogen or a hydrogen/argon mixture (typically in a 1:3 balance) in a cold wall type vertical flow deposition reactor as a function of measured total pressure (typically with a pressure of 2-10 Torr) with a deposition temperature of about 310-390° C., and an inlet precursor mole fraction of about 0.008-0.09. Temperatures of about 310-360° C. result in selective copper deposition under the above conditions.

Once the channels are filled with copper vertices 140, the device is planarized to remove the remaining PMMA. Alternatively, the PMMA may be removed using an acid, solvent or base bath or other mechanical and/or chemical process wherein the remaining PMMA is reactively or abrasively removed.

Figure 4:
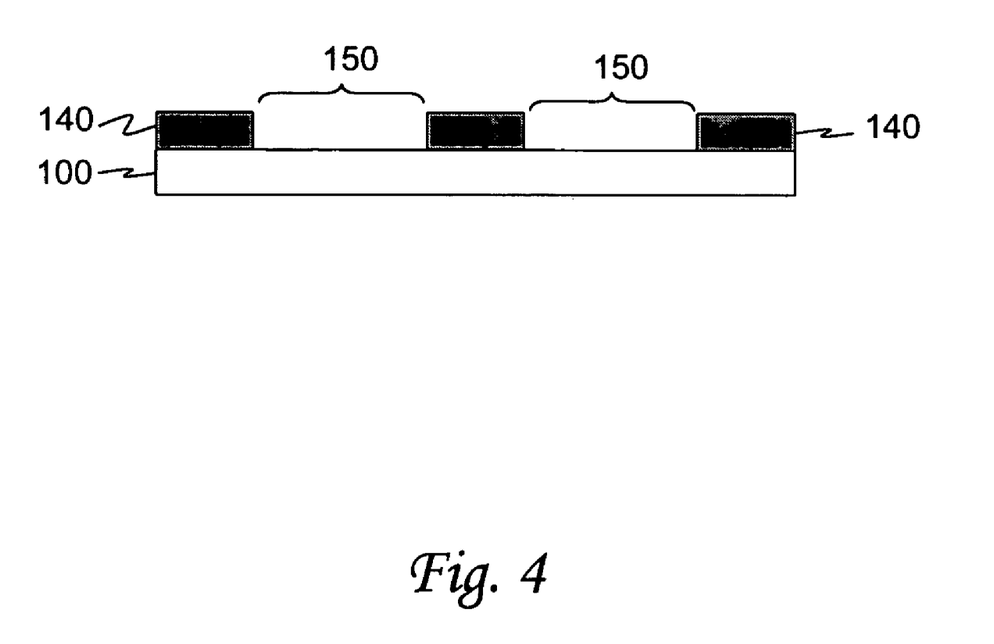
FIG. 4 is a side-view illustration of an additional portion of the manufacturing process.

FIG. 4 illustrates the device with all of the PMMA removed. Copper vertices 140 surround channel(s) 150. Channel(s) 150 constitute the hollow portion of the waveguide upon addition of a capping layer (as discussed herein). The copper vertices 140 possess surface finishes of optical-quality smoothness and are substantially perfectly vertical, as resulting from the extremely low cross-absorption and scattering rates of the x-rays into the non-irradiated portions of the PMMA. When x-rays and PMMA are utilized, the channel(s) 150 may have an approximate aspect ratio as high as 0.2/3000, wherein the channel 150 may be much less than a micron in width (or approximately as small as 0.2 microns) while having a height of many hundreds of microns (for example, 3 millimeters). When ultraviolet light and SU-8 are employed, the channel(s) 150 may have an approximate aspect ratio as large as 0.2/1000.

Figure 5:
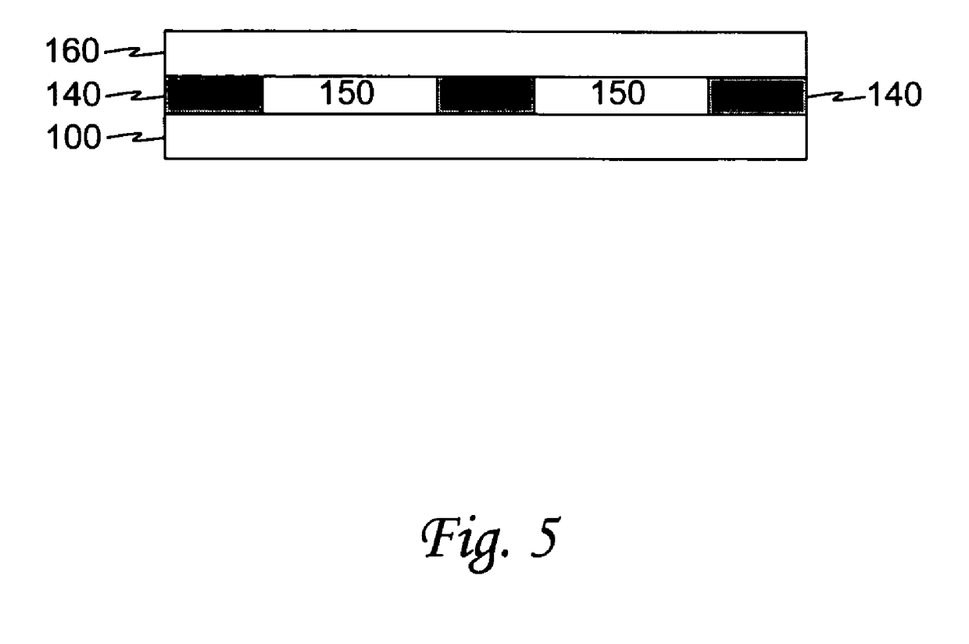
FIG. 5 is a side-view illustration of an embodiment of the present invention including a fully formed waveguide.

FIG. 5 illustrates an embodiment of the present invention wherein a cap layer has been added to cover the waveguide, thereby creating rectangular propagating portions 150 between copper vertices 140, lower layer 100, and upper layer 160. Upper layer 160 may be metallic or metallized, and may be glued or brazed to connect to the copper vertices 140.

Figure 6:
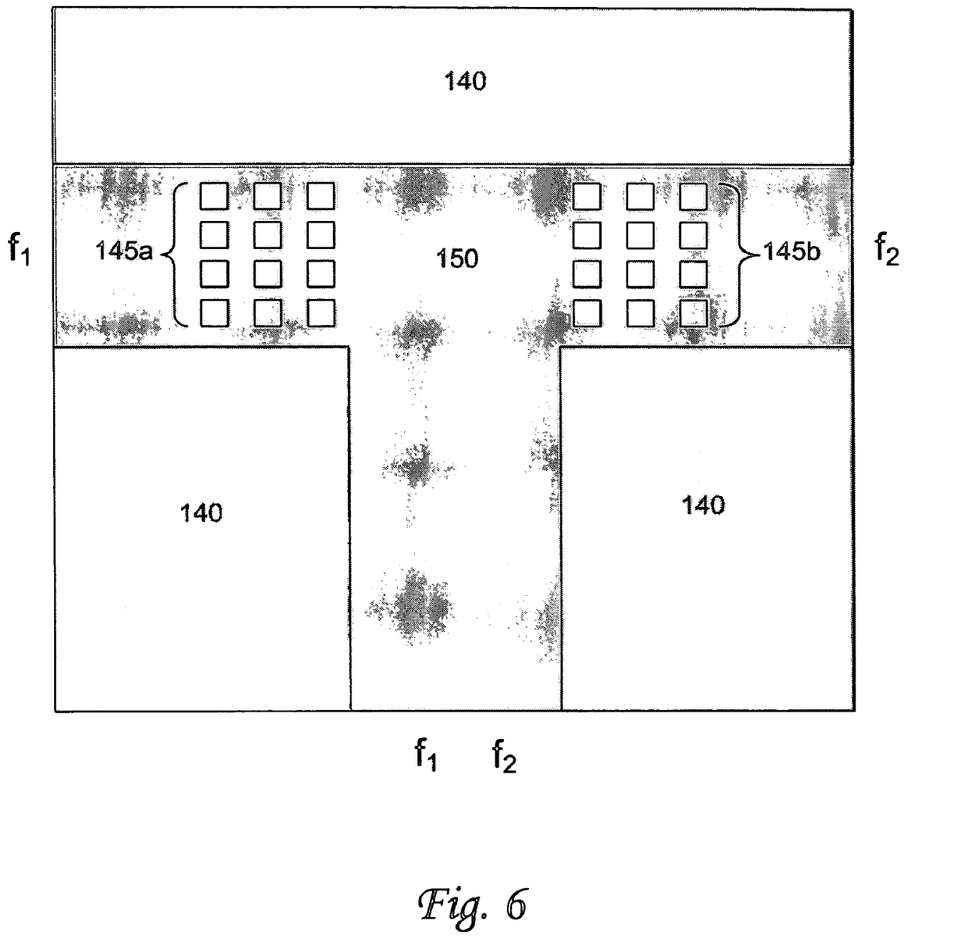
FIG. 6 is top-view illustration of an embodiment of the present invention including a waveguide (such as that depicted in FIG. 5) and further including a diplexer.

FIG. 6 is a top view of a further embodiment of the invention including diplexer columns 145a and 145b located within propagating channel(s) 150. The diplexer columns are created at the same time and with the identical process as described above in relation to the construction of the copper vertices 140. Because the process to create the vertices has previously been explained in detail it is not reiterated for purposes of brevity.

As known to the ordinarily skilled artisan, frequency propagation is a function of the shape of the waveform channel. Because diplexer columns 145a are more of a perfect square than diplexer columns 145b and fill a precise portion of the channel 150, a first frequency ($f_1$) will travel down the channel 150 including the portion with diplexer columns 145a, but will not travel down the portion of channel 150 which includes diplexer columns 145b. Similarly, because diplexer columns 145b are more rectangular than columns 145a and fill a precise portion of the channel 150, a second frequency ($f_2$) will only travel down the portion of channel 150 which includes diplexer columns 145b. While columns 145a and 145b are depicted as being squares and rectangles, the artisan of ordinary skill readily comprehends that the columns could easily be other shapes or even stepped platforms, or alterations in the body of the channel 150 itself, with the same or similar result.

Figure 7:
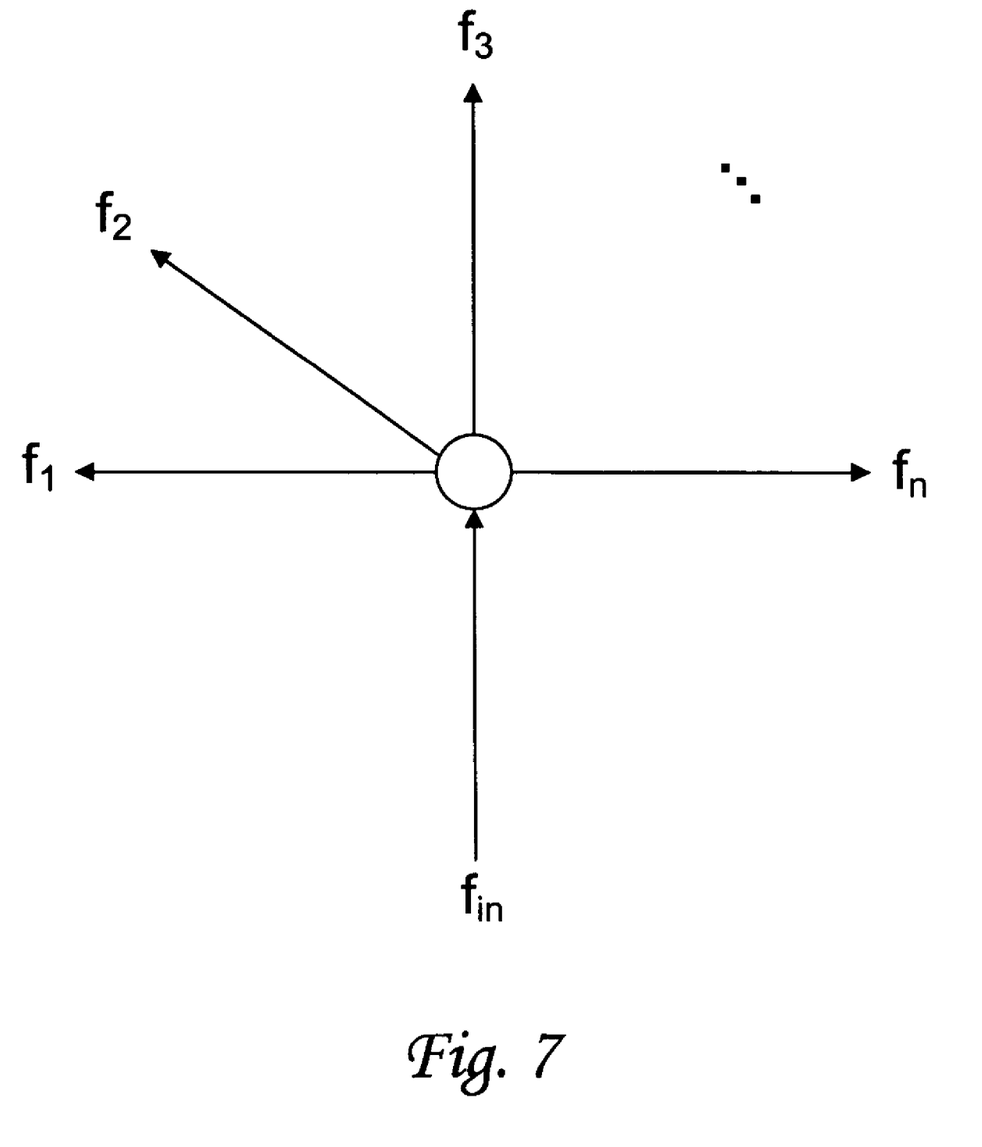
FIG. 7 is an illustrative schematic of the potential for frequency splitting using embodiments of the invention including, for example, the device depicted in FIG. 6.

FIG. 7 is an illustrative example of the functionality of a diplexer as included in the present invention. Any number of frequencies could be introduced to the waveguide of the present invention, with all of the introduced frequencies possessing their own propagating channel due to shaped columns, stepped platforms, or other variations in size and shape. For instance, $f_{in}$ could be separated so that each of $f_1$, $f_2$, $f_3$ ... $f_n$ propagates down its own waveguide portion of the channel(s) 150.

Figure 8:
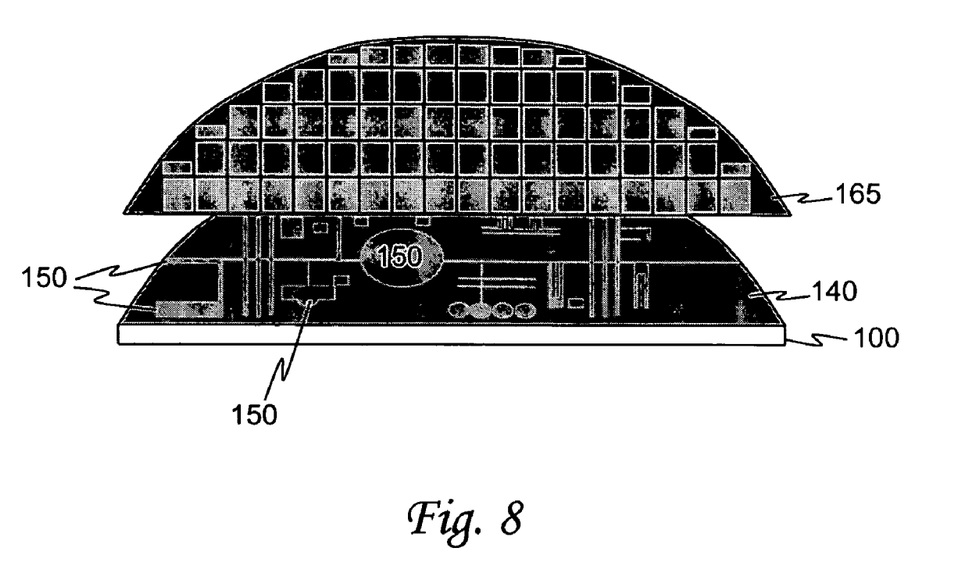
FIG. 8 is an angled side-view of an embodiment of the present invention including a waveguide with a top, capping layer of either metal or active monolithic circuitry.

FIG. 8 is an angled side view of a further embodiment of the present invention including vertices 140. Propagating channels 150 are located above the substrate 100 within the walls created by the copper vertices 140. The device depicted is therefore similar in nature to that depicted in FIG. 5, with the exception that the capping layer 160 is replaced with a structure 165 of active monolithic components, for example including at least one of an amplifier, a phase shifter, an attenuator, a mixer, a modulator, a step-up or step-down circuit, a multiplier, and/or another active circuit component for processing of signals propagated by the waveguide channel(s) 150.

The active capping layer may be created using known semiconductor manufacturing techniques, and may be attached to the vertices 140 by any known method to include gluing and/or brazing. The waveguide channel(s) 150 may include a diplexer as discussed above and/or as shown in FIG. 6, thereby allowing precise frequency processing for individual frequencies. For example, a plurality of frequencies may be input to the waveguide through channel(s) 150, wherein the plurality of frequencies are divided into singular frequencies by virtue of a diplexer located in the channel(s) 150, and where after the individual frequencies are each actively processed by active components in the capping layer 165. For instance, each of the individual frequencies may be particularly amplified or filtered by components located as part of the capping layer 165.

The above embodiments clearly have advantageous aspects. For instance, the waveguide of the present invention may be mass produced while maintaining the ability to transmit near-optical frequencies due to the surfaces of the copper vertices 140 possessing optical quality smoothness. The copper vertices 140 have a very high aspect ratio, thereby confining the electromagnetic transmission to the space primarily between the inner signal propagating surfaces and the top and bottom layers, allowing for distribution of the waveform over the full height of the metal 140, which reduces ohmic loss and draws the electric field out of the substrate, which in turn reduces dielectric loss. The reduced interaction between the fields and the substrate reduces dispersion, radiation loss, and the excitation of the substrate modes. The waveguide of the present invention may be fabricated with structures of variable thickness, adding design parameters and thereby increasing design flexibility. Due to the aforementioned features, the waveguide of the present invention is capable of providing a high-power, low-loss, low-dispersion uniplanar microwave circuit for use with a wide variety of applications.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. For example, some or all of the features of the different embodiments discussed above may be deleted from the embodiment. Therefore, the present invention is not intended to be limited to the embodiments described herein but is to be accorded the widest scope defined only by the claims below and equivalents thereof.

What is claimed is:

1. A micromachined microwave device comprising:
uniplanar monolithic circuitry with at least one waveguide channel formed in a metal plate layer; wherein said metal plate layer is capped with a metal or metallized cap layer; and
vertices of said at least one channel comprise sidewalls with a finish of optical quality smoothness of less than 50 nm rms roughness to allow for transmission of various frequencies including near-optical frequencies of up to approximately 300 GHz.

2. The microwave device of claim 1, wherein said sidewalls create an angle between 89.9 and 90.1 degrees in relation to a bottom of said channel.

3. The microwave device of claim 1, wherein said metal plate layer is made of one of the metals selected from the group consisting of: nickel, copper, and aluminum.

4. The microwave device of claim 1, wherein the circuit is capable of achieving attenuation of at least 0.064 dB/cm at 15.5 GHz.

5. The microwave device of claim 1, wherein said waveguide is fabricated using at least one of the fabrication techniques consisting of: lithography, electro-forming, and molding.

6. The microwave device of claim 1, wherein said waveguide is fabricated using LIGA fabrication techniques.

7. The microwave device of claim 1, wherein said waveguide further comprises at least one frequency-selective photonic bandgap arrangement that allows only a single frequency band to pass and which is fabricated concurrently with said at least one channel.

8. The microwave device of claim 7, further comprising multiple frequency-selective photonic bandgap arrangements that individually allow separate frequency bands to pass to different channels.

9. The microwave device of claim 1 wherein said metal or metallized cap layer comprises integrated active monolithic circuitry for microwave signal processing.

10. The microwave device of claim 9, wherein said integrated active monolithic circuitry comprises at least one of an amplifier, a phase shifter, an attenuator, a mixer, a modulator, a step-up or step-down circuit, and a multiplier.

11. A method for making a microwave device comprising:
creating a uniplanar waveguide with at least one channel formed in a metal plate layer; and
capping said metal plate layer with a metal or metallized cap layer; wherein vertices of said at least one channel comprise sidewalls with a finish of optical quality smoothness of less than 50 nm rms roughness to allow for transmission of various frequencies including near-optical frequencies of up to approximately 300 GHz.

12. The method of claim 11, further comprising creating said sidewalls with an angle between 89.9 and 90.1 degrees in relation to a bottom of said channel.

13. The method of claim 11, wherein said metal plate layer is made of one of the metals selected from the group consisting of: nickel, copper, and aluminum.

14. The method of claim 11, wherein the circuit is capable of achieving attenuation of at least of 0.064 dB/cm at 15.5 GHz.

15. The method of claim 11, wherein said creating further comprises fabricating said waveguide using at least one of the fabrication techniques selected from the list consisting of: lithography, electro-forming, and molding.

16. The method of claim 11, wherein said creating further comprises fabricating said waveguide using LIGA fabrication techniques.

17. The method of claim 11, further comprising creating said waveguide with at least one frequency-selective photonic bandgap arrangement that allows only a single frequency to pass and which is fabricated concurrently with said at least one channel.

18. The method of claim 17, further comprising creating multiple frequency-selective photonic bandgap arrangements that individually allow separate frequencies to pass to different channels.

19. The method of claim 11 wherein said metal or metallized cap layer comprises integrated active monolithic circuitry for microwave signal processing.

20. The method of claim 19, wherein said integrated active monolithic circuitry comprises at least one of an amplifier, a phase shifter, an attenuator, a mixer, a modulator, a step-up or step-down circuit, and a multiplier.

* * * * *